United States Patent
Hara et al.

(10) Patent No.: US 7,662,429 B2
(45) Date of Patent: Feb. 16, 2010

(54) LAMINATE COMPRISING POLYIMIDE AND CONDUCTOR LAYER, MULTI-LAYER WIRING BOARD WITH THE USE OF THE SAME AND PROCESS FOR PRODUCING THE SAME

(75) Inventors: Shoji Hara, Kanagawa (JP); Takashi Itoh, Shiga (JP); Hitoshi Nojiri, Shiga (JP); Masaru Nishinaka, Shiga (JP)

(73) Assignee: Kaneka Corporation, Osaka (JP)

( * ) Notice: Subject to any disclaimer, the term of this patent is extended or adjusted under 35 U.S.C. 154(b) by 230 days.

(21) Appl. No.: 09/782,169

(22) Filed: Feb. 14, 2001

(65) Prior Publication Data

US 2001/0030122 A1 Oct. 18, 2001

(30) Foreign Application Priority Data

Feb. 14, 2000 (JP) .............................. 2000-034853
Aug. 3, 2000 (JP) .............................. 2000-235130

(51) Int. Cl.
*B05D 5/12* (2006.01)
*C23C 14/00* (2006.01)

(52) U.S. Cl. ...................... 427/97.4; 427/523; 427/585; 427/383.1; 204/192.1

(58) Field of Classification Search ................... 427/96, 427/98, 99, 124, 372.2
See application file for complete search history.

(56) References Cited

U.S. PATENT DOCUMENTS

| 4,091,138 | A | * | 5/1978 | Takagi et al. | ................. | 428/209 |
| 4,808,274 | A | * | 2/1989 | Nguyen | ........................ | 204/15 |
| 5,156,710 | A | * | 10/1992 | Chen et al. | ............... | 156/273.3 |
| 5,681,443 | A | * | 10/1997 | Ameen et al. | ............... | 205/125 |
| 5,741,598 | A | * | 4/1998 | Shiotani et al. | ............. | 428/458 |
| 5,882,722 | A | * | 3/1999 | Kydd | ......................... | 427/123 |

FOREIGN PATENT DOCUMENTS

| JP | 54-066966 | * | 5/1979 |
| JP | 60640 | * | 3/1987 |
| JP | 11-240106 | * | 9/1999 |

* cited by examiner

*Primary Examiner*—Brian K Talbot
(74) *Attorney, Agent, or Firm*—Westerman, Hattori, Daniels & Adrian, LLP

(57) ABSTRACT

A laminate comprising a polyimide and a conductor layer, which is obtained by forming at least one conductor layer directly on the surface of a thermoplastic polyimide, is thermally fused by pressurizing and heating to thereby enhance the adhesion strength between the thermoplastic polyimide and the conductor layer. Thus, a laminate having an excellent adhesion strength between a conductor layer and a polyimide film can be obtained without performing any surface roughening treatment or using any adhesive metal layer.

17 Claims, No Drawings

LAMINATE COMPRISING POLYIMIDE AND CONDUCTOR LAYER, MULTI-LAYER WIRING BOARD WITH THE USE OF THE SAME AND PROCESS FOR PRODUCING THE SAME

FIELD OF THE INVENTION

This invention relates to laminates comprising a polyimide and a conductor layer which are to be used in electric/electronic circuit substrates, multi-layer wiring boards with the use of the same and processes for producing the same.

BACKGROUND ART

Because of being excellent in heat resistance, insulating properties, solvent resistance, cold resistance, etc., polyimide films have been widely employed as materials for electric/electronic parts under computer- or IC-control.

With the recent tendency toward miniaturized and thinned electric/electronic parts under computer- or IC-control, it has been required to miniaturize and thin wiring boards and IC packaging materials too. In substrates carrying electronic parts mounted thereon, lead-free solders are employed from the viewpoint of environmental protection. In its turn, polyimide films have attracted public attention as substrate materials withstanding elevated temperature for soldering.

However, there is a problem to be solved that polyimide films show only poor adhesion strength to conductor layers formed thereon. To metallize polyimide films, therefore, it has been a practice to mechanically roughen the surface by sandblasting to thereby enlarge the contact area of a conductor layer with a polyimide composition, or to employ an undercoating layer made of Cr, Ni, Ti, Co or V and prior to the formation of a conductor layer on a polyimide film by the sputtering method or the like. In case of using a physical roughening method such as sandblasting, projections due to fillers, etc. contained in the polyimide cannot be completely eliminated, which brings about a defect after the metallizing. In case of using a metallic undercoat layer, there sometimes arise undercutting due to the difference in the etching rates of the metallic undercoat layer and the conductor layer in the etching step of forming an electric circuit on the conductor layer, or short circuit between patterns due to the poor etching properties of the metallic undercoat. In case of using Cr, etc., there arises an additional problem of the disposal of the waste etching liquor.

SUMMARY OF THE INVENTION

Under these circumstances, the inventors have conducted intensive studies to solve the above-described problems and obtain laminates having improved adhesion strength between a polyimide and a conductor layer, thereby completing the invention. Accordingly, an object of the invention is to improve the adhesion strength of a conductor layer formed directly on the polyimide surface.

The laminates according to the invention, which consist of a polyimide and a conductor layer, can achieve a practically sufficient adhesion strength without performing any surface roughening treatment such as sandblasting or using any adhesive metal layer made of Cr, etc. Thus, these laminates are appropriately usable in wiring boards and FPC (flexible print circuit board).

The invention provides the production processes and laminates as will be specified below, thereby achieving the above-described object.

(1) A process for producing a laminate comprising a polyimide and a conductor layer, which comprises
    forming at least one conductor layer directly on at least one of the thermoplastic polyimide surfaces, and
    heating said laminate so that a polyimide and a conductor layer are directly thermally fused and the adhesion strength between the thermoplastic polyimide and the conductor layer is enhanced.

(2) A process for producing a laminate comprises a polyimide, a sheet material and a conductor layer, which comprises
    casting or applying a polyamic acid corresponding to a thermoplastic polyimide to at least one of a sheet material surface,
    imidating said polyamic acid to form a polyimide laminate having a thermoplastic polyimide surface,
    forming at least one conductor layer directly on at least one of the thermoplastic polyimide surfaces, and
    heating said laminate so that a polyimide and a conductor layer are directly thermally fused and the adhesion strength between the thermoplastic polyimide and the conductor layer is enhanced.

(3) A process for producing a laminate comprises a polyimide, a sheet material and a conductor layer comprises
    attaching at least one thermoplastic film to at least one of a sheet material surface to form a polyimide laminate having thermoplastic polyimide surface(s),
    forming at least one conductor layer directly on at least one of the thermoplastic polyimide surfaces, and
    heating said laminate so that a polyimide and a conductor layer are directly thermally fused and the adhesion strength between the thermoplastic polyimide and the conductor layer is enhanced.

(4) The process according to (2) or (3), wherein said sheet material is a non-thermoplastic polyimide film.

(5) The process according to any one of (1) to (3), wherein the thickness of said conductor layer is from 0.01 to 5 μm.

(6) The process according to any one of (1) to (3), wherein the heating temperature is 50° C. or higher.

(7) The process according any one of (1) to (3), wherein the heating temperature is higher by 30° C. or more than the glass transition temperature of the thermoplastic polyimide.

(8) The process according to any one of (1) to (3), wherein said heating step is carried out under the pressurized condition.

(9) The process according to (8), wherein the pressure at the pressurizing is 1 MPa or more.

(10) The process according to any one of (1) to (3), wherein said conductor layer is formed a dry plating method.

(11) The process according to (10), wherein said dry plating method is one selected from a group consisting of sputtering method, vacuum evaporation method, ion plating method and chemical evaporation method.

(12) The process according to (10), which further comprises
    increasing the total thickness of the conductor layer by a wet plating method.

(13) The process according to any one of (1) to (3), wherein said conductor layer comprises copper.

(14) A laminate comprising at least one polyimide layer and at least one conductor layer directly laminated on at least one surface of said polyimide, wherein the adhesion strength between the thermoplastic polyimide surface and the conductor layer is 5 N/cm or more when the total thickness of the conductor layer of 15 μm.

(15) A laminate comprising a sheet material, at least one polyimide layer provided on at least one surface of the sheet material, and at least one conductor layer directly provided on at least one surface of the polyimide layer,
wherein the adhesion strength between the thermoplastic polyimide surface and the conductor layer is 5 N/cm or more when the total thickness of the conductor layer of 15 μm.

(16) A multi-layer wiring board, which comprises the laminate as defined in any one of (1), (2), (3), (14) or (15).

The process according to the present invention preferably further comprises increasing the total thickness of the conductor layer by a wet plating method. The conductor layer preferably consists essentially of copper. The laminate according to the present invention is preferably used for a multi-layer wiring board.

DETAILED DESCRIPTION OF THE INVENTION

The laminate and polyimide according to the invention are obtained by forming at least one conductor layer directly on the surface of a thermoplastic polyimide, and thermally fusing the thus obtained laminate by pressurizing and heating to thereby enhance the adhesion strength between the thermoplastic polyimide and the conductor layer. It is still preferable that the laminate has thermoplastic polyimide layer(s) on one or both of the faces of a sheet material. Examples of the above-described sheet material include a non-thermoplastic polyimide film, a circuit substrate having a circuit preliminarily formed thereon, and a metal plate containing one or more metals such as Cu, Fe or Ni. Among all, a non-thermoplastic polyimide film is preferable therefor, since it enables the production of a lightweight laminate and can be processed roll-to-roll. Although the polyimide on which the conductor layer is directly formed is not particularly restricted, it is preferable to use one having non-thermoplastic polyimide surface from the viewpoint of performing the subsequent heating treatment for the thermal fusion. It is still preferable to use a laminate having thermoplastic polyimide layer(s) formed on one or both of the faces of a non-thermoplastic polyimide film. As the thermoplastic polyimide to be used herein, it is preferable to use thermoplastic polyimides obtained by the dehydrocyclization of polyamic acids represented by the following general formula (I):

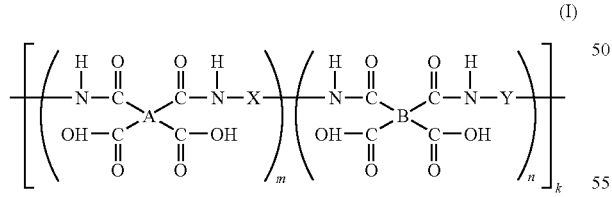

(I)

wherein k represents a positive number of 1 or more; m and n are equal respectively to the repeating molar fractions in the polymer chain and m ranges from about 0.00 to about 0.95 while n ranges from about 1.00 to about 0.05, provided that m+n is equal to 1; A and B represent each a tetravalent organic group; and X represents a divalent organic group.

In the general formula (I), it is preferable that A and B are at least two members selected from the group (1) consisting of the tetravalent organic groups as shown below:

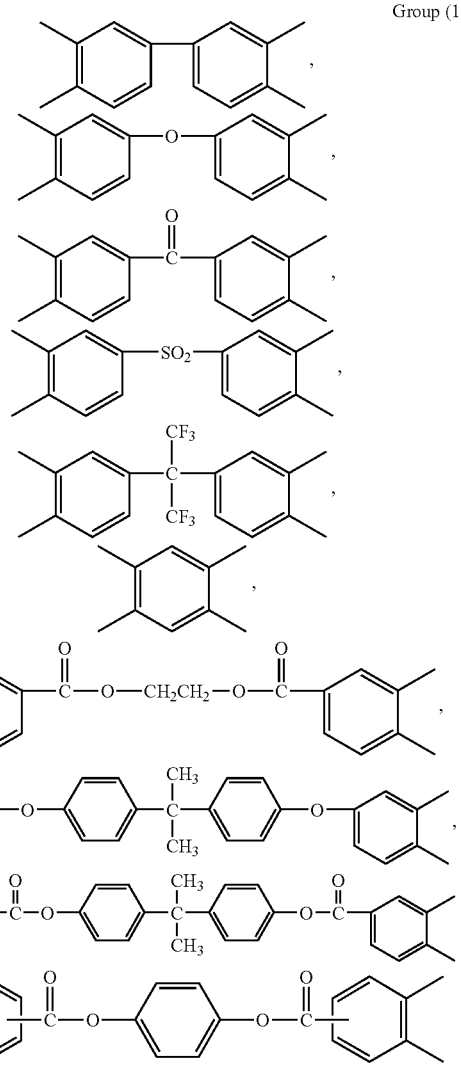

Also, it is particularly preferable that X and Y are each at least one member selected from the group (2) consisting of the divalent organic groups as shown below:

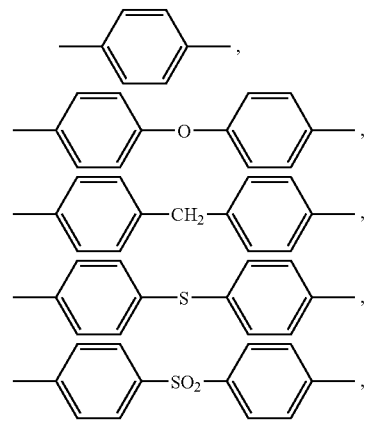

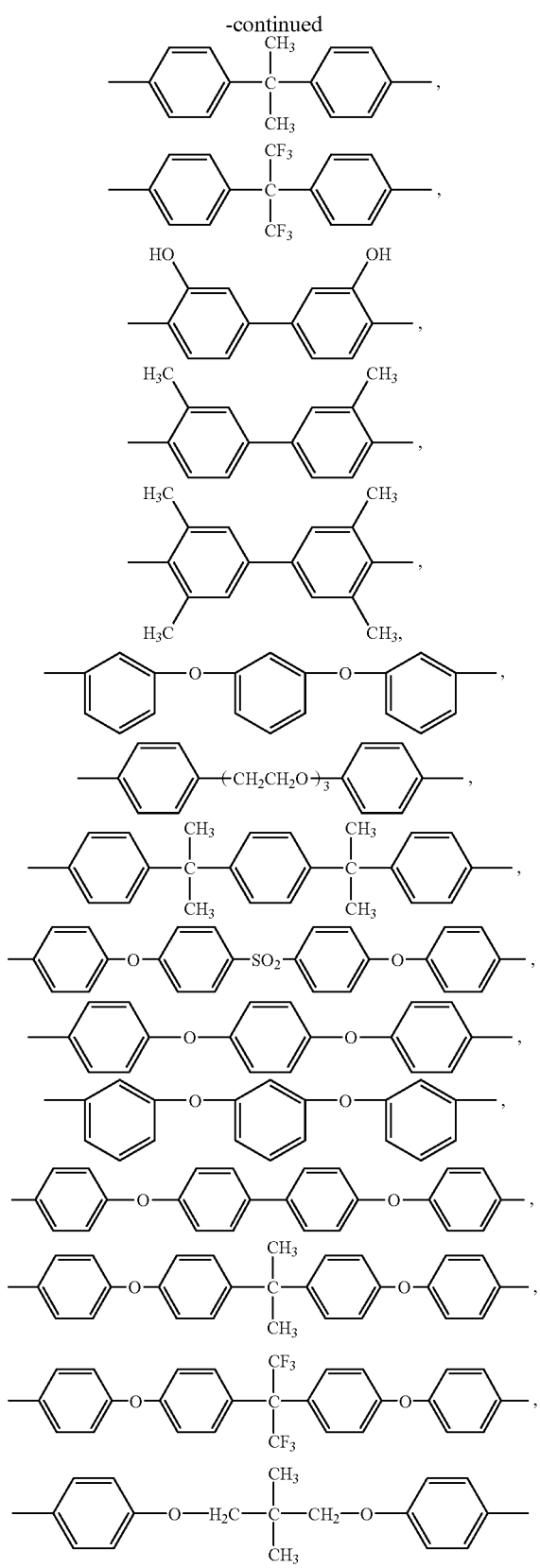

Such a thermoplastic polyimide is formed on the surface of a sheet material (in particular, a non-thermoplastic polyimide film) typically by casting or applying a polyamic acid represented by the general formula (1) on one or both of the faces of a sheet material (in particular, a non-thermoplastic polyimide film) and then imidating the polyamic acid by a thermal or chemical method to thereby give a polyimide laminate having thermoplastic polyimide surface(s). In case of a thermoplastic polyimide soluble in a solvent, it is also possible to obtain a laminate by applying such a solution and then drying. As a matter of course, it is also possible that the thermoplastic polyimide is not formed on the surface of a non-thermoplastic polyimide film but used as such as a single layer film.

A conductor layer can be formed on the surface of this polyimide by a publicly known dry plating method such as sputtering method, evaporation method, EB evaporation method, CVD method or ion plating method. It is particularly preferable to employ sputtering method, vacuum evaporation method, ion plating method or chemical evaporation method therefor. The conductor layer may be formed by the dry plating method alone. Alternatively, it is possible that the first conductor layer having a thickness of from 0.01 to 5 μm is formed and then the second and third conductor layers are deposited thereon by a dry plating method or a wet plating method (electrolytic plating, non-electrolytic plating, etc.) to give a total conductor layer thickness involving the first conductor layer of 1 to 18 μm. As the first conductor layer, use can be made of a single metal such as Cr, Ni, Ti, V, Co, Pt or Au or an alloy. Considering the processability in the re-processing step of etching the conductor layer and the disposal of the waste etching liquor, it is desirable that the first conductor layer is made of Cu. The heating treatment for enhancing the adhesion strength between the polyimide and the conductor layer may be carried out either after the formation of the first conductor layer or after the formation of the second conductor layer. The heating treatment may be carried out in the atmosphere. Alternatively, it may be carried out in an inert gas (Ar, $N_2$, He, etc.) or in a vacuum oven so as to prevent the conductor layer from oxidation. It is desirable to carry out the pressurizing and heating treatment after the formation of the conductor layer by the dry plating method. Although the heating temperature is nor particularly specified, it is preferable for achieving a favorable result to perform the heating at a temperature of 50° C. or higher, still preferably at 100° C. or higher, in case of, for example, heating in the atmosphere for about 30 minutes. The maximum temperature in the heating treatment may be arbitrarily determined so long as the oxidation of the copper layer due to the heating falls within an acceptable range. In case of heating in the atmosphere for 30 minutes, for example, it is preferable that the heating temperature is not higher than 300° C., still preferably not higher than 250° C.

Further, it is preferable that the pressurizing and heating treatment is carried out under a pressure of 1 MPa or more, still preferably 2 MPa or more. It is preferable that the heating temperature is higher than the glass transition temperature of the thermoplastic polyimide, since a heat fusion effect can be achieved in such a case. It is still preferable that the heating temperature is higher by 30° C. or more than the glass transition temperature of the thermoplastic polyimide. The pressurizing and heating treatment may be carried out in an inert gas (Ar, $N_2$, He, etc.) or by using a vacuum press apparatus so as to prevent the conductor layer from oxidation. The maximum temperature in the pressurizing and heating treatment may be arbitrarily determined so long as the flow rate of the thermoplastic polyimide resin due to the pressurizing and heating treatment falls within an acceptable range. In case of performing the pressurizing and heating treatment under a pressure of 3 MPa for 10 minutes, for example, it is preferable that the heating temperature does not exceed the temperature higher by 130° C. than the glass transition temperature, still preferably not exceed the temperature higher by 100° C. than the glass transition temperature. In case of using a polyimide having a glass transition temperature of 150° C., for example, the heating temperature preferably ranges from 150 to 280° C., still preferably from 180 to 250° C. After the completion of the pressurizing and heating treatment, the total conductor layer thickness can be increased to 3 to 35 μm by electrolytic plating or non-electrolytic plating. The laminate thus obtained by increasing the total conductor layer thickness preferably has an adhesion strength between the polyimide surface and the conductor layer of 5 N/cm or more at the total thickness of the conductor layer of 15 μm. The term "adhesion strength between the polyimide surface and the conductor layer at the total thickness of the conductor layer of 15 μm" means the adhesion strength measured by a peeling test wherein the conductor layer of 3 mm in width is peeled at a peeling speed of 50 mm/min in a direction 90° to the polyimide.

Prior to the electrolytic plating or non-electrolytic plating, it is preferable to treat the surface of the conductor layer having been subjected to the pressurizing and heating treatment with the use of an aqueous solution containing one or more compounds capable of generating hypochlorite ion, chlorite ion or perchlorate ion such as sodium hypochlorite, potassium chlorite or potassium perchlorate.

As described above, the invention makes it possible to obtain a laminate having an excellent adhesion strength between a conductor layer and a polyimide without performing any surface roughening treatment on the polyimide film surface such as sandblasting or using any adhesive undercoating metal layer made of Cr, Ni, etc. as in dry plating. The effects of the invention are not worsened by physically roughening the polyimide surface before the formation of the conductor layer, roughening the polyimide surface by a plasma treatment in an inert gas and/or introducing a functional group, or using an adhesive metal layer to thereby further enhance the adhesion strength.

EXAMPLES

The invention will be illustrated in greater detail by reference to the following Examples. However, it is to be understood that the invention is not construed as being limited thereto.

In these Examples, the glass transition temperatures of thermoplastic polyimides were measured on the basis of dynamic viscoelasticity data by using DMS2000 (manufactured by JEOL Ltd.) in accordance with the glass transition temperature DMA method.

Example 1

Under cooling the whole system with ice/water, 39.9 g of 1,2-bis[2-(4-aminophenoxy)ethoxy]ethane (hereinafter referred to as DA3EG) was introduced by using 596.2 g of dimethylformamide (hereinafter referred to as DMF) into a 2000 ml sealed separable flask having been purged with nitrogen. After stirring for 15 minutes, 73.9 g of 2,2'-bis[4-(4-aminophenoxy)phenyl]propane (hereinafter referred to as BAPP) was added thereto by using 100 g of DMF and the resultant mixture was stirred for additional 15 minutes. Subsequently, 82.1 g of 3,3',4,4'-ethylene glycol dibenzoate tetracarboxylic dianhydride (hereinafter referred to as TMEG) was added thereto by using 20 g of DMF. Then 29 g of 3,3',4,4'-benzophenone tetracarboxylic dianhydride (hereinafter referred to as BTDA) was added thereto by using 20 g of DMF and the resultant mixture was stirred for 30 minutes. After the completion of stirring, a solution of 4.1 g of TMEG in 36.9 g of DMF was slowly added while paying attention to the viscosity of the contents of the flask. Then the reaction mixture was allowed to stand for 1 hour under stirring to thereby give a polyamic acid solution. A 100 g portion of this polyamic acid solution was weighed and a chemical curing agent containing 11.37 g of acetic anhydride, 11.18 g of isoquinoline and 11.95 g of DMF was added thereto. After defoaming by centrifugation, the mixture was cast onto a PET film and heated at 80° C. for 25 minutes. After peeling off the PET film, imidation was carried out by heating at 150° C. and 200° C. each for 25 minutes to thereby give thermoplastic polyimide films of 25 μm in thickness. These thermoplastic films thus obtained were each set on a substrate holder of a magnetron sputtering apparatus HSM-720 (manufactured by Shimadzu Corporation) and the apparatus was evacuated to $4 \times 10^{-4}$ Pa. Subsequently, Ar gas was blown so that the pressure within the magnetron sputtering apparatus was maintained at 0.6 Pa. In this state, a thin copper film of 0.1 μm in thickness was formed on the film by using a copper target with a DC pour source of a current value of 0.5A. Before the formation of the thin film, pre-sputtering was carried out for 15 minutes. Thus, 3 samples each having a copper thin film formed on a thermoplastic film were prepared. Then these samples were cut into pieces of 12 cm×8 cm and subjected to electrolytic copper plating by the electrolytic plating method while passing an electric current (2 A) until the conductor thickness attained 20 μm. Each sample was allowed to stand at room temperature for 4 days and then heated for 30 minutes. The heating temperature varied from sample to sample, i.e., 100° C., 140° C. and 200° C. Subsequently, the copper oxide film formed on the conductor layer surface was eliminated by using a 5% by weight sulfuric acid solution. After applying a circuit tape of 3 mm in width, etching was performed with the use of a cupric chloride solution. After taking off the circuit tape, the sample was dried at 50° C. for 30 minutes to give a pattern of 3 mm in width. Next, the peel strength of the pattern of 3 mm in width was determined. The peel strength was measured by pulling in a direction 90° to the polyimide at a speed of 50 mm/min. The peel strength was measured thrice and the average was employed. Table 1 summarizes the measurement results.

TABLE 1

|  | Heating temp. (° C.) | Peel strength (N/cm) |
|---|---|---|
| Ex. 1 | 100 | 4.1 |
|  | 140 | 4.3 |
|  | 200 | 4.4 |
| Comp. Ex. 1 | no | 1.0 |

Example 2

Under cooling the whole system with ice/water, 123.1 g of BAPP was introduced into a 2000 ml three-necked separable flask having been purged with nitrogen by using 716.2 g of DMF. After stirring for 15 minutes, 33.8 g of BTDA was added thereto by using 20 g of DMF. Subsequently, 76.0 g of TMEG was added thereto by using 20 g of DMF and the resultant mixture was stirred for additional 15 minutes. After stirring for 30 minutes, 4.1 g of additional TMEG dissolved in 36.9 g of DMF was slowly added while paying attention to the viscosity of the contents of the flask. Then the reaction mixture was allowed to stand for 1 hour under stirring to thereby give a polyamic acid solution. Separately, a 17% by weight solution of a polyamic acid, which had been synthesized by using pyromellitic dianhydride/p-phenylene(trimellitic acid monoester acid anhydride)/p-phenylenediamine/4,4'-diaminodiphenyl ether at a molar ratio of 5/5/4/6, in DMF was defoamed by centrifugation and then cast on an aluminum foil to give a final thickness of 17 μm. This laminate comprising the aluminum foil and the polyamic acid solution was heated to 110° C. for 4 minutes to thereby give a self-supporting gel film. This gel film was immersed in the polyamic acid solution (i.e., the precursor of a thermoplastic polyimide) prepared above. After eliminating the excessive polyamic acid so as to give the final thickness in one face of the thermoplastic polyimide layer of 4 μm, the laminate was heated to 150° C., 200° C., 250° C., 300° C. and 350° C. each for 1 minute to thereby give bonding sheets of 25 μm in total thickness. By using these bonding sheets, samples were prepared as in Example 1 but the heating treatment after allowing to stand at room temperature for 4 days was carried out at two different temperatures, i.e., 170° C. and 220° C. Next, a pattern (3 mm in width) for measuring the peel strength was formed as in Example 1 and the peel strength was measured. Table 2 summarizes the measurement results.

TABLE 2

|  | Heating temp. (° C.) | Peel strength (N/cm) |
|---|---|---|
| Ex. 2 | 170 | 4.2 |
|  | 220 | 4.4 |
| Comp. Ex. 2 | no | 1.8 |

Comparative Example 1

By using the same film as Example 1, a sample was prepared and the peel strength was measured as in Example 1 but omitting the heating treatment after allowing to stand at room temperature for 4 days. The measurement result was shown in Table 1.

Comparative Example 2

By using the same bonding sheet as Example 2, a sample was prepared and the peel strength was measured as in Example 1 but omitting the heating treatment after allowing to stand at room temperature for 4 days. The measurement result was shown in Table 2.

Example 3

Under cooling the whole system with ice/water, 39.9 g of DA3EG was introduced by using 596.2 g of DMF into a 2000 ml sealed separable flask having been purged with nitrogen. After stirring for 15 minutes, 73.9 g of BAPP was added thereto by using 100 g of DMF and the resultant mixture was stirred for additional 15 minutes. Subsequently, 82.1 g of TMEG was added thereto by using 20 g of DMF. Then 29 g of BTDA was added thereto by using 20 g of DMF and the resultant mixture was stirred for 30 minutes. After the completion of stirring, a solution of 4.1 g of TMEG in 36.9 g of DMF was slowly added while paying attention to the viscosity of the contents of the flask. Then the reaction mixture was allowed to stand for 1 hour under stirring to thereby give a polyamic acid solution. A 100 g portion of this polyamic acid solution was weighed and a chemical curing agent containing 11.37 g of acetic anhydride, 11.18 g of isoquinoline and 11.95 g of DMF was added thereto. After defoaming by centrifugation, the mixture was cast onto a PET film and heated at 80° C. for 25 minutes. After peeling off the PET film, imidation was carried out by heating at 150° C. and 200° C. each for 25 minutes to thereby give thermoplastic polyimide films of 25 μm in thickness. These polyimide films showed a glass transition temperature of 150° C. These thermoplastic films thus obtained were each set on a substrate holder of a magnetron sputtering apparatus HSM-720 (manufactured by Shimadzu Corporation) and the apparatus was evacuated to $4\times10^{-4}$ Pa. Subsequently, Ar gas was blown so that the pressure within the magnetron sputtering apparatus was maintained at 0.6 Pa. In this state, a thin copper film of 0.3 μm in thickness was formed on the film by using a copper target with a DC pour source of a current value of 0.5A. Before the formation of the thin film, pre-sputtering was carried out for 15 minutes. Thus, 6 samples each having a copper thin film formed on a thermoplastic film were prepared. Then these samples were cut into pieces of 12 cm×8 cm and coated on both faces by using a fluoroplastic film sheet (Niftron manufactured by Nitto Denko Corporation) of 0.2 mm in thickness. Further, both faces of these samples were coated with a rubber sheet of 5 mm in thickness and a ferroplate. Then these samples were pressed under a pressure of 3 MPa for 10 minutes while varying the pressing temperature (100° C., 150° C., 180° C., 200° C., 250° C., 300° C.).

After surface-washing with a 5% aqueous solution of sulfuric acid for 30 seconds, these samples were subjected to electrolytic copper plating by the electrolytic plating method while passing an electric current (2 A) until the conductor thickness attained 15 μm. Each sample was allowed to stand at room temperature for 4 days. After applying a circuit tape of 3 mm in width, etching was performed with the use of a cupric chloride solution. After taking off the circuit tape, the sample was dried at 50° C. for 30 minutes to give a pattern of 3 mm in width. Next, the peel strength of the pattern of 3 mm in width was determined. The peel strength was measured by pulling in a direction 90° to the polyimide at a speed of 50 mm/min. The peel strength was measured thrice and the average was employed. In the measurement of the peel strength, use was made of an Autograph S-100-C (manufactured by Shimadzu Corporation). Table 3 summarizes the measurement results.

TABLE 3

|  | Heating temp. (° C.) | Peel strength (N/cm) |
|---|---|---|
| Ex. 3 | 100 | 4.1 |
|  | 150 | 1.5 |
|  | 180 | 5.2 |
|  | 200 | 5.6 |
|  | 250 | 5.3 |
|  | 300 | 4.4 |
| Comp. Ex. 3 | no | 1.2 |
| Ex. 3a | no pressurizing 150° C. | 3.0 |

Example 4

Under cooling the whole system with ice/water, 123.1 g of BAPP was introduced into a 2000 ml three-necked separable flask having been purged with nitrogen by using 716.2 g of DMF. After stirring for 15 minutes, 33.8 g of BTDA was added thereto by using 20 g of DMF. Subsequently, 76.0 g of TMEG was added thereto by using 20 g of DMF and the resultant mixture was stirred for 30 minutes. After stirring for 30 minutes, 4.1 g of additional TMEG dissolved in 36.9 g of DMF was slowly added while paying attention to the viscosity of the contents of the flask. Then the reaction mixture was allowed to stand for 1 hour under stirring to thereby give a polyamic acid solution (A). A thermoplastic polyimide obtained by drying and imidating a portion of this polyamic acid solution had a glass transition temperature of 190° C. Separately, a 17% by weight solution of a polyamic acid(B), which had been synthesized by using pyromellitic dianhydride/p-phenylene(trimellitic acid monoester acid anhydride)/p-phenylenediamine/4,4'-diaminodiphenyl ether at a molar ratio of 5/5/4/6, in DMF was defoamed by centrifugation and then cast on an aluminum foil to give a final thickness of 17 μm. This laminate comprising the aluminum foil and the polyamic acid solution was heated to 110° C. for 4 minutes to thereby give a self-supporting gel film. This gel film was immersed in the polyamic acid solution (A) (i.e., the precursor of a thermoplastic polyimide) prepared above. After eliminating the excessive polyamic acid so as to give the final thickness in one face of the thermoplastic polyimide layer of 4 μm, the laminate was heated to 150° C., 200° C., 250° C., 300° C. and 350° C. each for 1 minute to thereby give bonding sheets of 25 μm in total thickness. By using these bonding sheets, samples were prepared as in Example 3 but performing the pressurizing and heating treatment at 150° C., 220° C. and 250° C. (the same pressure and time were employed as in Example 3). Next, a pattern (3 mm in width) for measuring the peel strength was formed as in Example 3 and the peel strength was measured. Table 4 summarizes the measurement results.

TABLE 4

|  | Heating temp. (° C.) | Peel strength (N/cm) |
|---|---|---|
| Ex. 4 | 150 | 1.9 |
|  | 220 | 5.0 |
|  | 250 | 5.6 |
| Comp. Ex. 5 | no | 1.8 |

By using the same film as Example 3, a sample was prepared and the peel strength was measured as in Example 3 but omitting the pressurizing and heating treatment. The measurement result was shown in Table 3.

Comparative Example 4

By using the same film as Example 3, a sample was prepared and the peel strength was measured as in Example 3 but maintaining the sample at 150° C. for 10 minutes in an oven after the formation of the sputter metal film without performing the pressurizing treatment. The measurement result was shown in Table 3.

Comparative Example 5

By using the same bonding sheet as Example 4, a sample was prepared and the peel strength was measured as in Example 3 but omitting the pressurizing and heating treatment. The measurement result was shown in Table 4.

While the invention has been described in detail and with reference to specific embodiments thereof, it will be apparent to one skilled in the art that various changes and modifications can be made therein without departing from the spirit and scope thereof.

This application is based on Japanese patent application No. 2000-034853 filed on Feb. 14, 2000 and Japanese patent application No. 2000-235130 filed on Aug. 3, 2000, the entire contents of which are incorporated hereinto by reference.

What is claimed is:

1. A process for producing a laminate comprising a polyimide and a conductor layer, which comprises
    forming at least one conductor layer directly adhering with at least one surface of a thermoplastic polyimide film to obtain a laminate, and
    heating said laminate after said laminate is formed so that the adhesion strength between the thermoplastic polyimide film and the conductor layer is enhanced.

2. A process for producing a laminate comprising a polyimide, a sheet material and a conductor layer, which comprises
    casting or applying a polyamic acid corresponding to a thermoplastic polyimide to at least one of a sheet material surface,
    imidating said polyamic acid to form a polyimide laminate having a thermoplastic polyimide surface,
    forming at least one conductor layer directly adhering with at least one of the thermoplastic polyimide surfaces to obtain a laminate, and
    heating said laminate so that the adhesion strength between the thermoplastic polyimide and the conductor layer is enhanced.

3. A process for producing a laminate comprising a polyimide, a sheet material and a conductor layer comprises
    attaching at least one thermoplastic film to at least one of a sheet material surface to form a polyimide laminate having thermoplastic polyimide surface(s),
    forming at least one conductor layer directly adhering with at least one of the thermoplastic polyimide surfaces, and
    heating said laminate so that the adhesion strength between the thermoplastic polyimide and the conductor layer is enhanced.

4. The process according to claims 2 or 3, wherein said sheet material is a non-thermoplastic polyimide film.

5. The process according to any one of claims 1 to 3, wherein the thickness of said conductor layer is from 0.01 to 5 μm.

6. The process according to any one of claims 1 to 3, wherein the heating temperature is 50° C. or higher.

7. The process according any one of claims 1 to 3, wherein the heating temperature is higher by 30° C. or more than the glass transition temperature of the thermoplastic polyimide.

8. The process according to any one of claims 1 to 3, wherein said heating step is carried out under pressure.

9. The process according to claim 8, wherein the pressure at the pressurizing is 1 MPa or more.

10. The process according to any one of claims 1 to 3, wherein said conductor layer is formed a dry plating method.

11. The process according to claim 10, wherein said dry plating method is one selected from a group consisting of sputtering method, vacuum evaporation method, ion plating method and chemical evaporation method.

12. The process according to claim 10, which further comprises increasing the total thickness of the conductor layer by a wet plating method.

13. The process according to any one of claims 1 to 3, wherein said conductor layer comprises copper.

14. A process for producing a laminate comprising:
    dry plating at least one conductor layer directly adhering with at least one surface of a thermoplastic polyimide film to obtain a laminate, and
    heating said laminate so that the adhesive strength between the thermoplastic polyimide film and the conductor layer is enhanced.

15. A process producing a laminate comprising:

providing a thermoplastic polyimide film having at least one surface;

forming a conductor layer directly adhering with said at least one surface; and heating the thermoplastic polyimide film and the formed conductor layer.

16. The process according to any one of claims 1 to 3 or 14, wherein said laminate has a peel strength of at least 1.0 N/cm prior said heating.

17. The process according to claim 15, wherein said conductor directly adheres with said at least one surface with a peel strength of at least 1.0 N/cm prior to said heating.

* * * * *